(12) United States Patent
Juang et al.

(10) Patent No.: US 8,938,695 B1
(45) Date of Patent: Jan. 20, 2015

(54) SIGNATURE ANALYTICS FOR IMPROVING LITHOGRAPHIC PROCESS OF MANUFACTURING SEMICONDUCTOR DEVICES

(71) Applicant: DMO Systems Limited, Hsinchu County (TW)

(72) Inventors: Shauh-Teh Juang, Saratoga, CA (US); Jason Zse-Cherng Lin, Saratoga, CA (US)

(73) Assignee: DMO Systems Limited, HsinChu County (TW)

( * ) Notice: Subject to any disclaimer, the term of this patent is extended or adjusted under 35 U.S.C. 154(b) by 0 days.

(21) Appl. No.: 14/150,772

(22) Filed: Jan. 9, 2014

(51) Int. Cl.
*G06F 17/50* (2006.01)

(52) U.S. Cl.
CPC .................................. *G06F 17/5081* (2013.01)
USPC ................ 716/52; 716/54; 716/112; 716/136

(58) Field of Classification Search
None
See application file for complete search history.

(56) References Cited

U.S. PATENT DOCUMENTS

| | | | |
|---|---|---|---|
| 6,797,526 B2 * | 9/2004 | Tanaka et al. | 438/5 |
| 6,841,403 B2 * | 1/2005 | Tanaka et al. | 438/14 |
| 7,047,469 B2 * | 5/2006 | Chiu | 714/732 |
| 7,570,800 B2 * | 8/2009 | Lin et al. | 382/149 |
| 7,676,077 B2 * | 3/2010 | Kulkarni et al. | 382/144 |
| 2008/0298670 A1 * | 12/2008 | Nakagaki et al. | 382/149 |
| 2010/0332172 A1 * | 12/2010 | Kaufman et al. | 702/81 |
| 2012/0185818 A1 * | 7/2012 | Leu et al. | 716/136 |

* cited by examiner

*Primary Examiner* — Leigh Garbowski

(57) ABSTRACT

A number of wafers of a semiconductor device are inspected to generate a plurality of wafer inspection data. A method for identifying critical hot spots to improve lithographic process of manufacturing the semiconductor device uses design signature analytics according to the plurality of wafer inspection data with reference to the design data of the semiconductor device. Design signature analytics includes global alignment, full chip pattern correlation, pattern characterization and design signature inference. The global alignment compensates for the physical coordinate offsets between the chip design data and the wafer inspection data. The full chip pattern correlation uses multi-stage pattern matching and grouping to identify highly repeating defects as hot spots. Pattern characterization extracts the design patterns and design signatures of the highly repeating defects. Design signature inference analyses the design signatures, identifies critical design signatures and determines the criticality of the critical design signatures.

14 Claims, 6 Drawing Sheets

SIGNATURE ANALYTICS FOR IMPROVING LITHOGRAPHIC PROCESS OF MANUFACTURING SEMICONDUCTOR DEVICES

BACKGROUND OF THE INVENTION

1. Field of the Invention

The present invention relates generally to semiconductor device fabrication, and more specifically to a method of using design signature analytics for improving lithographic process of manufacturing semiconductor device.

2. Description of Related Arts

Semiconductor devices are manufactured by fabricating many layers of circuit patterns on wafers to form massive transistors for integration as complicated circuits. In the manufacturing flow of semiconductor devices, lithography process is responsible for transferring the circuit patterns created by circuit designers onto wafers.

Photomasks with opaque and clear patterns according to the circuit patterns are used for patterning device layers on wafers. Distortion of the patterns can result from the effect of the neighboring patterns on the photomask and optical diffraction. Optical proximity correction (OPC) and lithographic process check (LPC) are important techniques commonly used for correcting the pattern distortion for design for manufacturability (DFM).

FIG. 1 shows a typical flow in initial setup and on-going tune-up for optimizing the lithography process of manufacturing semiconductor devices. Circuit patterns for manufacturing the photomask of a device layer is described in a design data file generated by the circuit designer shown in block 101 that contains design data in GDS or OASIS format. The design data may be random circuit patterns generated from random layout generator (RLG) or product qualification vehicle (PQV) from vendors or pilot customers. Block 102 shows OPC creation that generates the required OPC by using the OPC model and recipe and DFM model and recipe that include additional manufacturing effects other than OPC from block 103. After OPC creation, Block 102 also performs OPC verification based on OPC model and LPC verification based on DFM model.

OPC and LPC verification also predicts potential yield limiting hot spots caused by specific layout and patterns. As shown in block 104, wafers manufactured by the lithography process using the OPC photomask are examined by either optical or e-beam inspector and metrology machine to detect defects and measure critical dimensions in the hot spots. Inspection and metrology data of the predicted hot spots are fed back to block 103 to tune the models and recipes of OPC and DFM.

As technology advances to 20nm and beyond, designs are scaled down and the scaling down to small geometries has resulted in many systematic manufacturing variations that limit manufacturing yield more than the random variations. The interaction of small geometries within the optical proximity and the lithography process creates highly nonlinear systematic variations that are difficult or impossible to model in OPC or DFM. As a result, many manufacturing critical hot spots cannot be predicted and uncovered by the OPC and LPC verification in the setup and tuning flow shown in FIG. 1. Consequentially, these uncovered manufacturing critical hot spots may lead to catastrophic yield loss in mass production of the semiconductor device.

SUMMARY OF THE INVENTION

The present invention has been made to overcome the above mentioned challenge and deficiency in predicting and uncovering manufacturing critical hot spots for improving lithographic process of manufacturing semiconductor devices. Accordingly, the present invention provides a method for using design data signatures to identify new manufacturing critical hot spots that cannot be predicted by the OPC and LPC verification.

Accordingly, the design signature analytics of the present invention comprises global alignment for compensating the coordinate offsets among wafer inspection data, wafer critical dimension and review data, and chip design data, full chip pattern correlation for finding highly repeating defects from the above data that have been aligned, pattern characterization for extracting design signatures for the highly repeating defects and design signature inference for determining criticality of the design signatures.

In the present invention, a hierarchical approach for multi-stage pattern matching and grouping is used to perform the full chip pattern correlation. Massive data from multiple wafer inspections are divided into a plurality of input data sets and fed to the first stage processing of the multiple-stage pattern matching and grouping. The outputs of the first stage processing can further be divided into multiple sets of second stage input data sets for performing a second stage processing.

The hierarchical approach of the present invention allows the massive input data and intermediate stage output data to be further divided into multiple sets of input data for the following stage processing. Finally, the final stage processing is executed to bin and group highly repeating defects from multiple wafer inspections. Data filtering and statistical analysis may be performed to reduce the number of defects in the massive inspection data at the initial stage and/or any subsequent stage of data processing.

According to the present invention, design signatures extracted for hot spots can be analyzed and ranked. Critical design signatures that are stored and updated in a critical design signature library can be used to assist OPC/DFM model and recipe setup and tuning The critical design signatures can also be used to search the full chip design data for micro care areas where the circuit patterns have the same critical design signatures for later wafer inspection and metrology.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
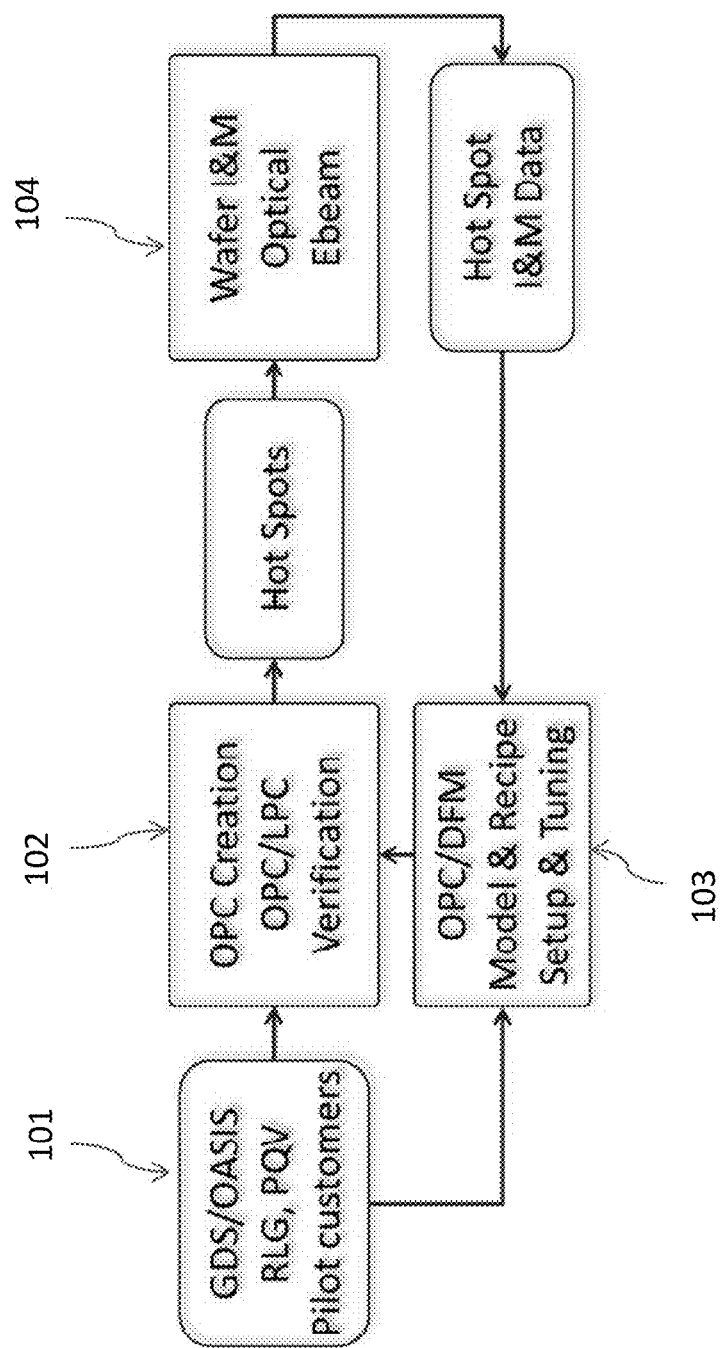
FIG. 1 shows a typical flow in initial setup and tuning for optimizing the lithography process of manufacturing semiconductor devices.
Figure 2:
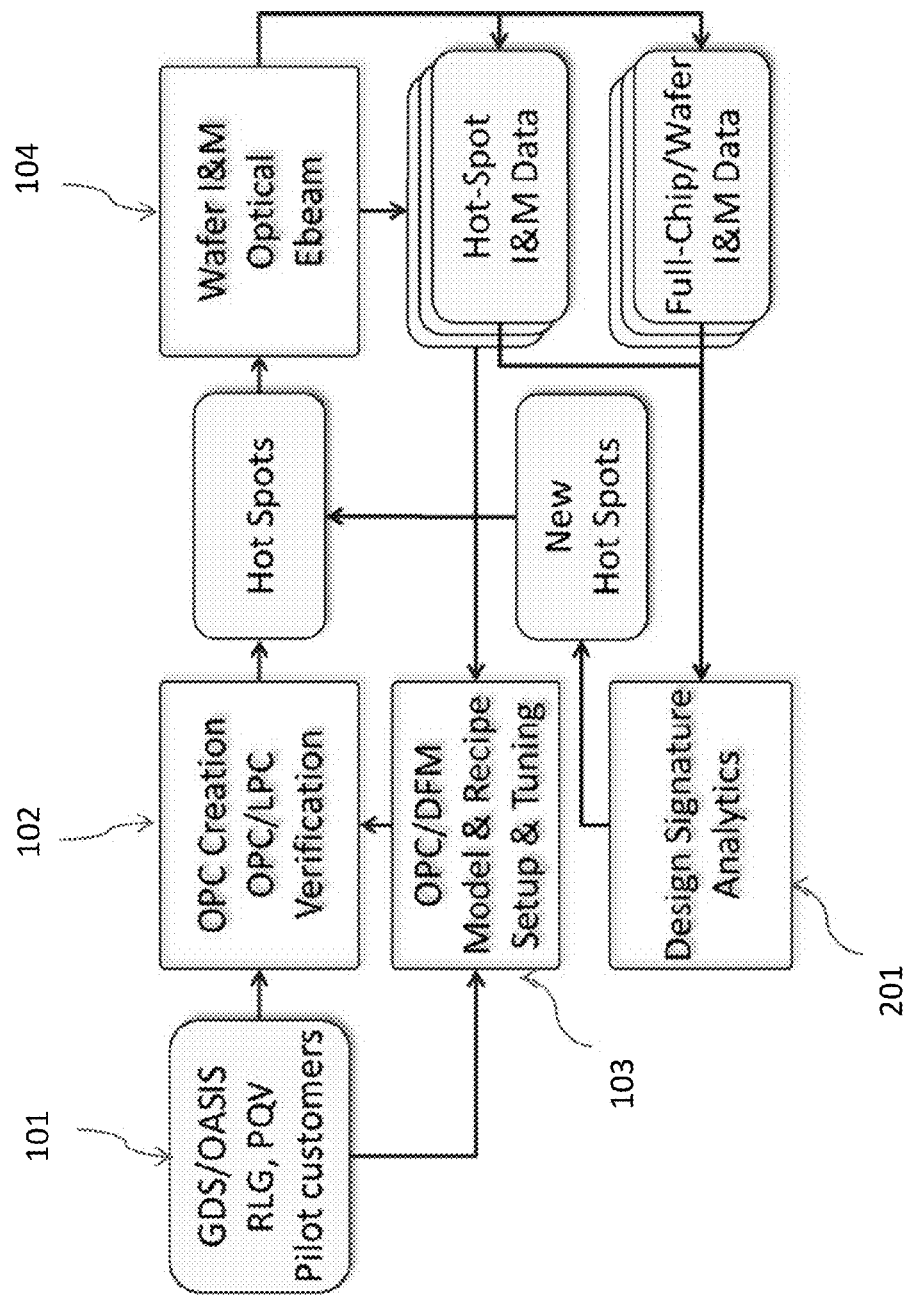
FIG. 2 shows an improved flow for optimizing the lithography process of manufacturing semiconductor devices by using design signature analytics according to the present invention.

FIG. 2 shows an improved flow for optimizing the lithography process of manufacturing semiconductor devices according to the present invention. As can be seen in FIG. 2, design signature analytics 201 based on predicted hot spots and massive full wafer inspection and metrology data is used to identify new manufacturing critical hot spots that cannot be predicted by the OPC and LPC verification.

Figure 3:
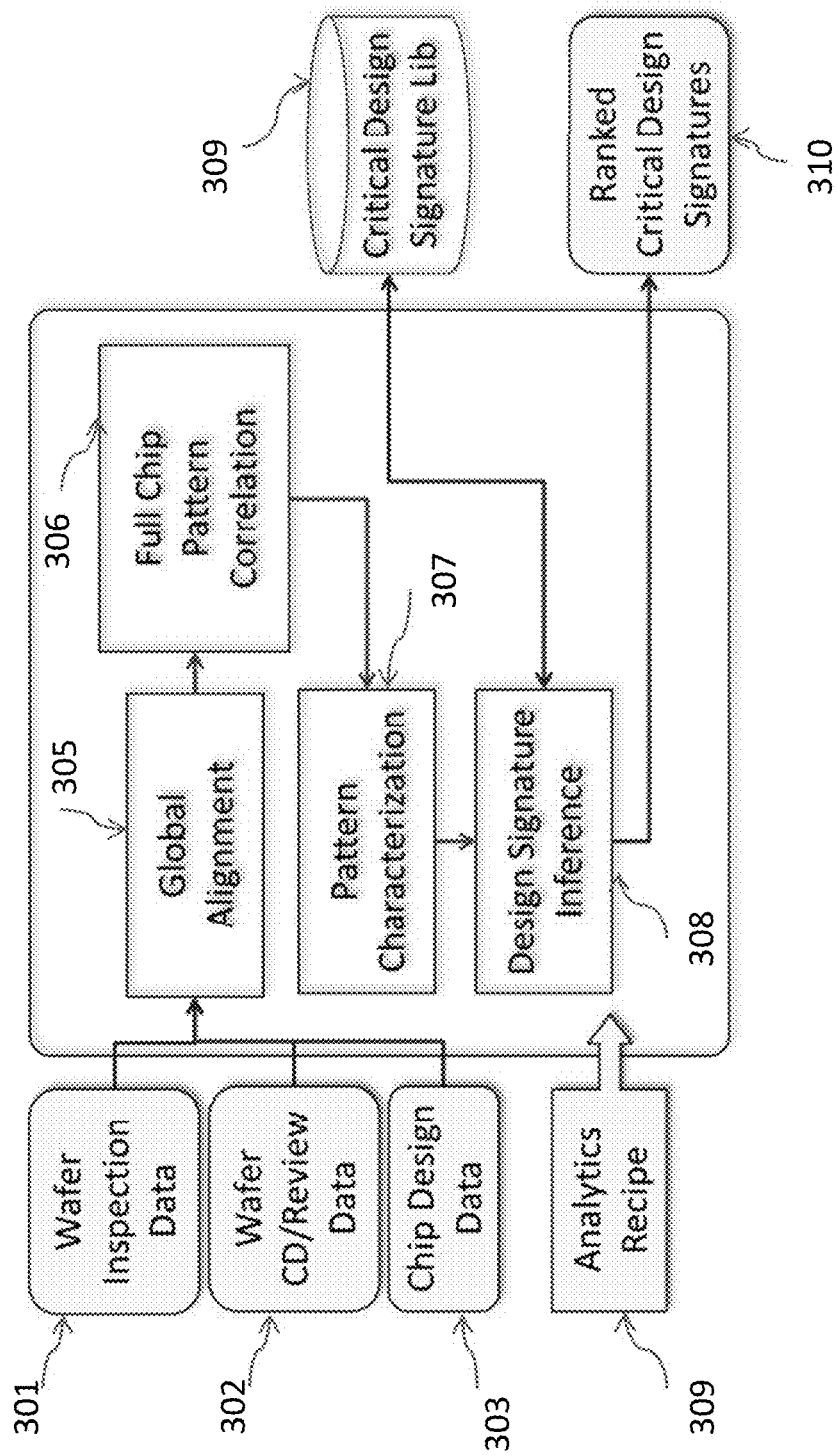
FIG. 3 shows a block diagram of the design signature analytics according to the present invention.

FIG. 3 shows a block diagram of the design signature analytics according to the present invention. As shown in FIG. 3, the input data for the design signature analytics comprises wafer inspection data 301, wafer critical dimension and review data 302 and chip design data 303. In order to extract useful and meaningful correlation, massive amount of inspection and metrology data are desirable. As those data are acquired, it is inevitable that the physical coordinates of different sets of measured data are not aligned. Furthermore, the offsets between the physical coordinates and the chip design data have to be compensated for design signature analytics. Global alignment 305 is performed among multiple sets of input data.

As can be expected, circuit patterns for critical hot spots are more susceptible to systematic defects. Systematic defects occur on wafers systematically across multiple dies and multiple wafers. In other words, systematic defects are usually highly repeating defects. Highly repeating defects with identical or similar background patterns may present design signatures for critical hot spots.

According to the present invention, criticality of the design signatures for background patterns of highly repeating defects may be analyzed in several ways. Within a die, repeating defects can be correlated to determine intra-die criticality of the design signature. Within a wafer, repeating defects can be correlated to determine inter-die criticality of the design signature. Across multiple wafers, repeating defects can be correlated and analyzed to determine inter-wafer criticality of the design signature. Full chip pattern correlation 306 is performed based on massive wafer inspection data to identify highly repeating defects.

After the full chip pattern correlation 306, pattern characterization 307 is performed on the circuit patterns determined to be highly repeating and systematic defects to extract design signatures. Design signature inference 308 analyzes and concludes the intra-die, inter-die or inter-wafer criticality of the design signature. Analytics recipe 309 provides various filtering parameters and/or grouping criteria and repeating threshold for the design signature analytics according to specific requirements. Critical design signatures can be stored and updated in the critical design signature library 309. Critical design signatures can further be ranked based on the criticality 310.

Figure 4:
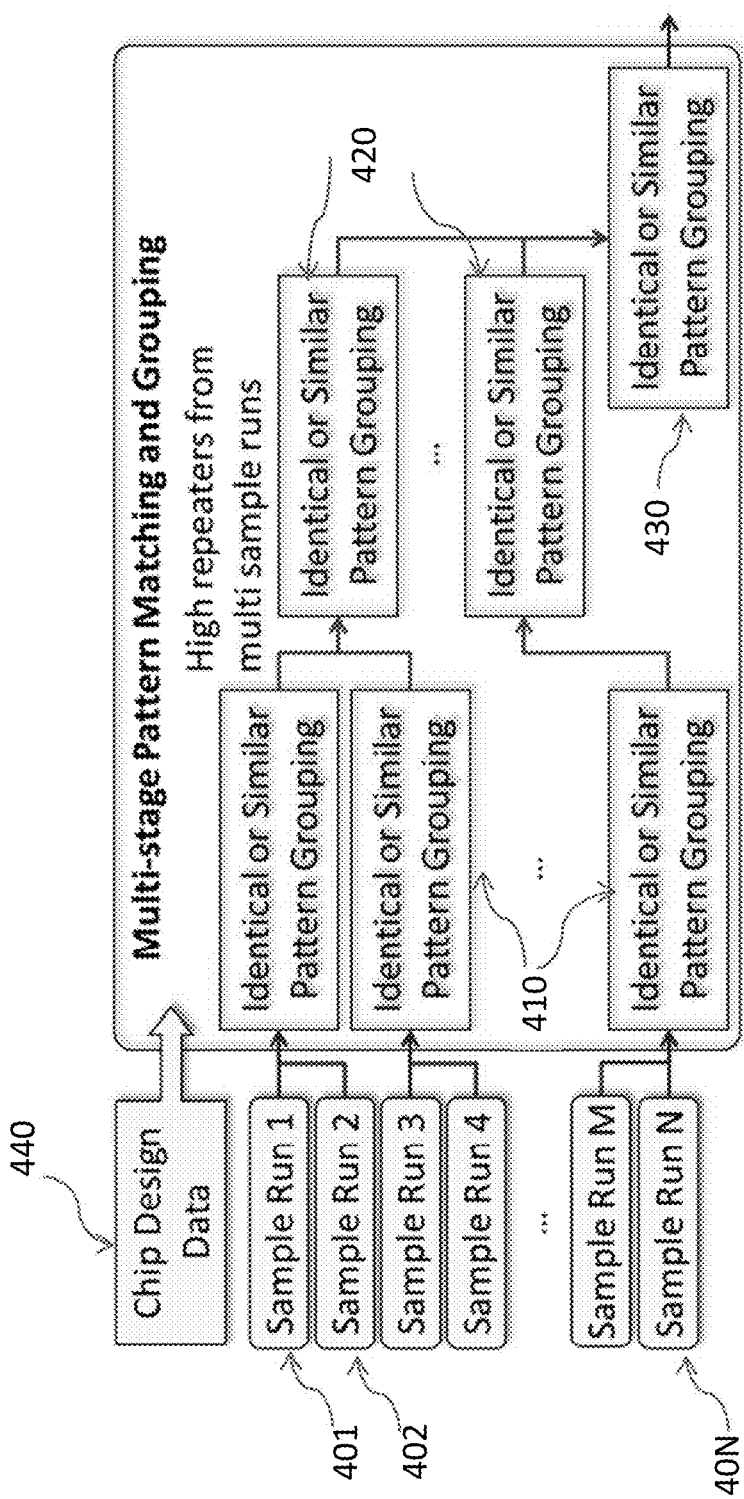
FIG. 4 shows a block diagram for the multi-stage pattern matching and grouping of the design signature analytics of the present invention.

In the present invention, a hierarchical approach for multi-stage pattern matching and grouping is used to perform the full chip pattern correlation 306. FIG. 4 shows a block diagram for the multi-stage pattern matching and grouping. As can be seen, massive data from multiple wafer inspection runs 401-40N and chip design data 440 are fed to multi-stage pattern matching and grouping. The massive data can be the output of multiple wafer inspections of a specific chip design at a specific manufacturing step or multiple manufacturing steps. For a specific manufacturing process, massive data can also be obtained from multiple wafer inspections of multiple chip designs so as to create the critical design signature library for such manufacturing process.

In the multi-stage pattern matching and grouping, a first stage processing is executed by a plurality of instances of identical or similar pattern grouping 410 by dividing the massive data into a plurality of first stage input data sets. Each instance of identical or similar pattern grouping 410 receives one first stage input data set that comprises one or more wafer inspection results. In one aspect of the present invention, the division of massive data into a plurality of first stage input data sets not only reduces the storage requirement in the identical or similar pattern group 410 but also makes it possible to distribute the identical or similar pattern grouping 410 among multiple computing nodes.

Depending on the number of multiple wafer inspections, the outputs of the first stage processing can further be divided into multiple sets of second stage input data sets for performing a second stage processing with plurality of instances of identical or similar grouping 420. The hierarchical approach of the present invention allows the massive input data and intermediate stage output data to be divided for the following stage processing. FIG. 4 shows only one intermediate stage processing. Finally, the final stage processing is executed with a single instance of identical or similar pattern grouping 430 when the amount of massive data is manageable. Each stage of identical or similar pattern processing groups and bins highly repeating defects from multiple wafer inspections.

Figure 5:
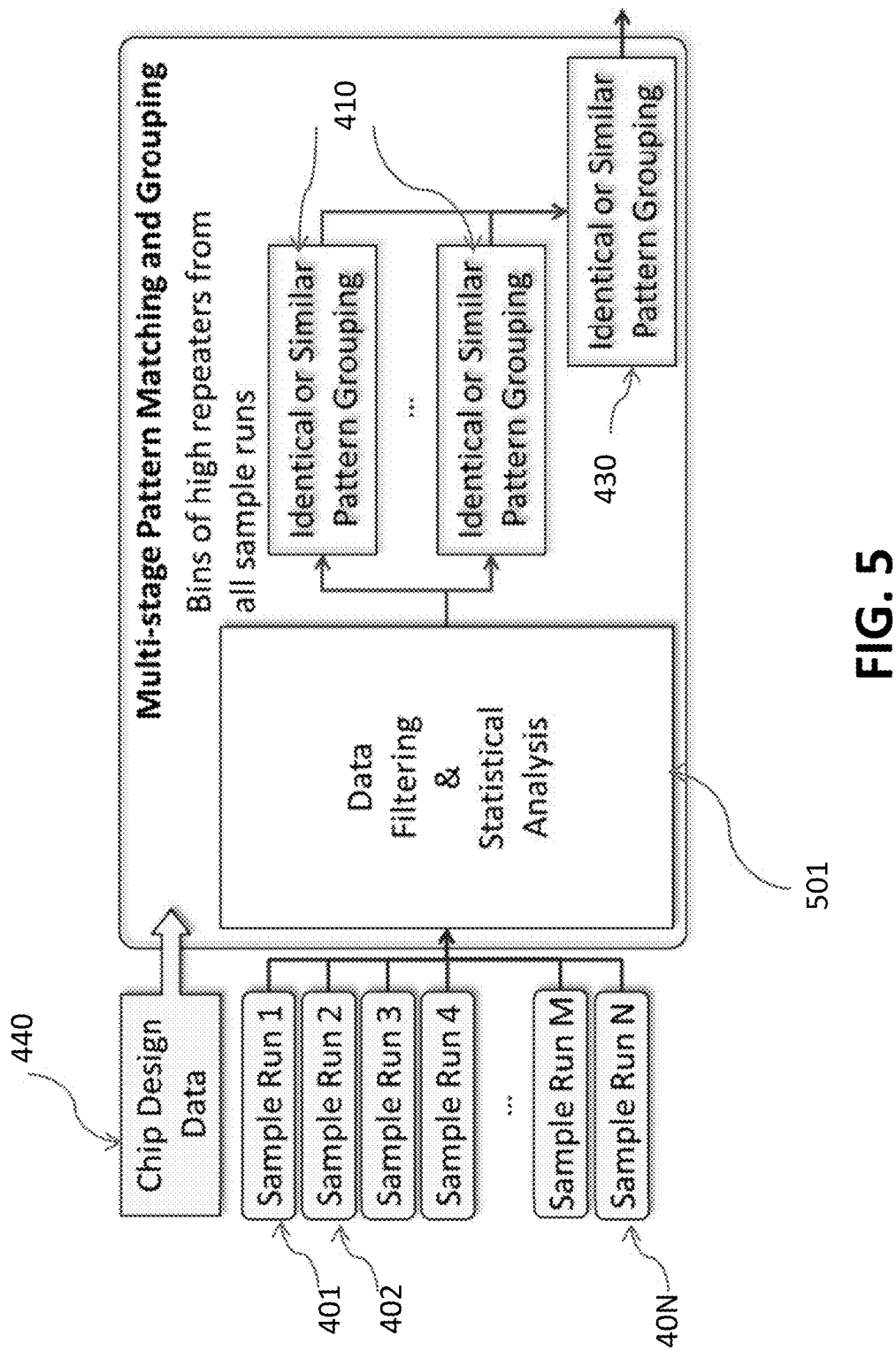
FIG. 5 shows a block diagram of multi-stage matching and grouping that includes data filtering and statistical analysis before performing identical or similar pattern grouping.

The design signature analytics of the present invention is based on massive data mining to extract defect correlation and identify critical design signatures. In many cases, it may be desirable to push the sensitivity of wafer inspections to very high limit in order to not miss critical and hard to detect repeating defects. However, under such a circumstance, it may be necessary to reduce the number of defects in the massive inspection data by first performing data filtering and some statistical analysis. FIG. 5 shows a block diagram of multi-stage matching and grouping that includes data filtering and statistical analysis 501 and two stages of identical or similar pattern grouping.

As mentioned above, for a specific chip design at a specific manufacturing step, massive inspection data collected at a targeted manufacturing step can be correlated for identifying highly repeating systematic defects. Full-chip design layer for the targeted manufacturing step can be analyzed to learn the layout pattern regularity for the systematic defect. Full-chip design layers beneath the design layer of the targeted manufacturing step can also be correlated to learn the three dimensional topological effects of the design signatures.

In accordance with the present invention, the multi-stage pattern matching and grouping can further be performed on the same massive data by varying the radius of the design pattern clips to be matched to learn the two dimensional proximity effects of the design signatures. For example, a given circuit pattern may be more susceptible to highly repeating defects when it is surrounded by certain type of patterns.

As described above, in the present invention identical or similar pattern matching and grouping can be executed in the multi-stage pattern matching and grouping. Identical pattern matching and grouping can match and group design patterns that are identical. For the similar pattern matching and grouping, one approach to accomplish it is by matching a certain percentage of identical central patterns between two design patterns to be matched. Based on requirements, some use cases may prefer identical pattern matching and grouping while other use cases may need similar pattern matching and grouping.

In accordance with the present invention, the multi-stage pattern matching and grouping can further be performed on the same massive data by shifting the center of the design pattern clips to be matched to provide refined compensation for the acquisition deviation of inspection and metrology data.

Figure 6:
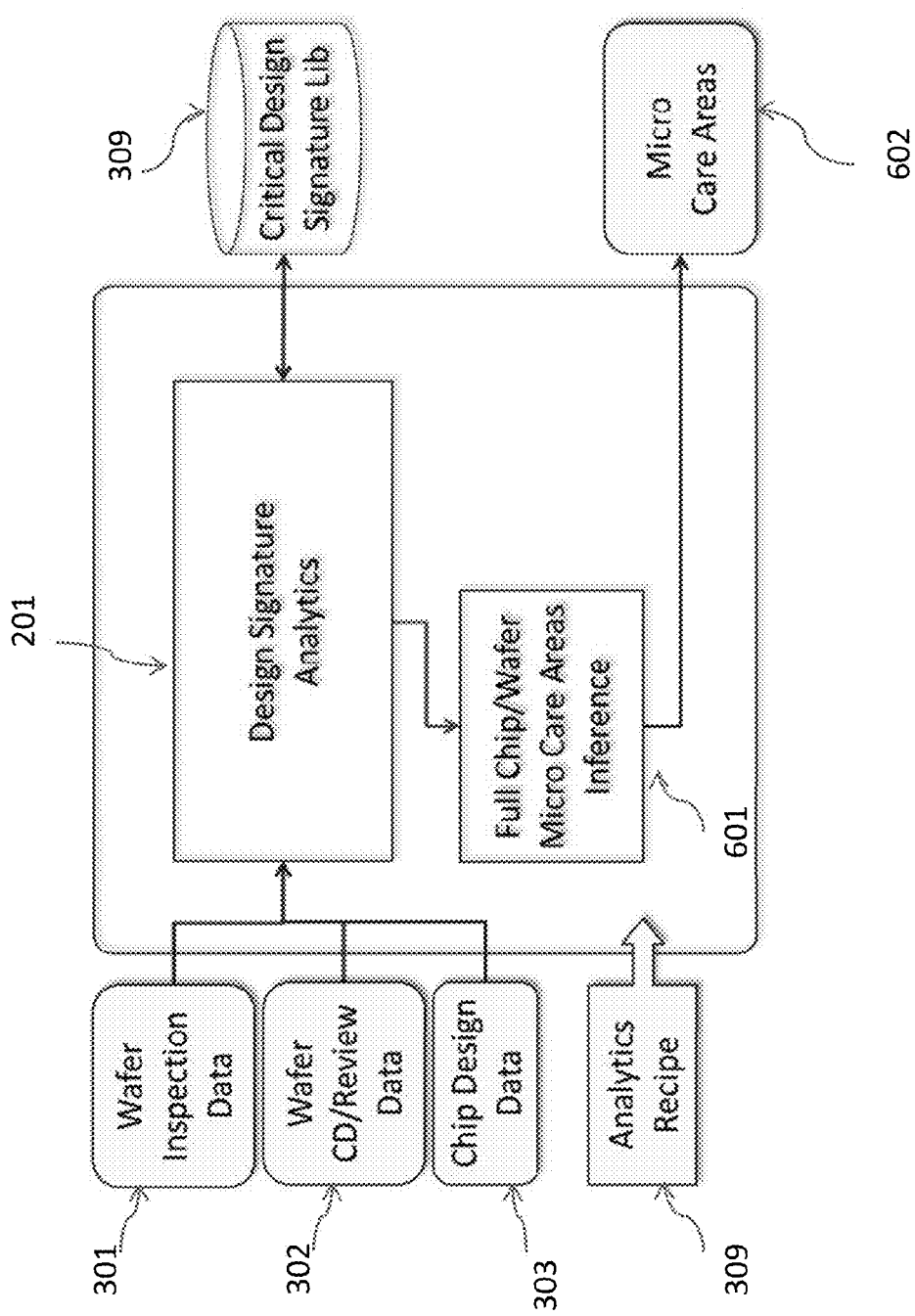
FIG. 6 shows a block diagram of using the design signature analytics to search for micro care areas that have the same critical design signature in the full chip.

The design signature analytics described above can be used to define micro cares for inspecting hot critical spots on wafers at a specific manufacturing step. As shown in FIG. 6, the critical design signatures can be used by the full chip/wafer micro care areas inference 601 to search for all the areas where the circuit patterns have the same design signatures in the full-chip design data. The areas found can be the micro care areas 602 that need to be inspected with higher sensitivity across all the dies on the later manufactured wafers.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method of using design signature analytics for improving lithographic process in manufacturing semiconductor devices, comprising the steps of:
   manufacturing a plurality of wafers according to a chip design data;
   inspecting said plurality of wafers to generate a plurality of wafer inspection data;
   using the plurality of wafer inspection data and the chip design data to perform design signature analytics for identifying critical hot spots;
   wherein said design signature analytics includes multi-stage pattern matching and grouping for identifying highly repeating defects from the plurality of wafer inspection data as said critical hot spots based on said chip design data.

2. The method as claimed in claim 1, wherein said design signature analytics further uses wafer critical dimension and review data.

3. The method as claimed in claim 1, wherein said multi-stage pattern matching and grouping includes:
   first stage processing that executes a plurality of instances of first stage pattern matching and grouping, each instance receiving wafer inspection data of one or more wafers and generating a first stage output data; and
   final stage processing that receives all of said first stage output data and executes final stage pattern matching and grouping to identify said highly repeating defects.

4. The method as claimed in claim 3, wherein at least one of said first stage pattern matching and grouping and said final stage pattern matching and grouping is identical pattern matching and grouping.

5. The method as claimed in claim 3, wherein at least one of said first stage pattern matching and grouping and said final stage pattern matching and grouping is similar pattern matching and grouping, and said similar pattern matching and grouping is accomplished by matching a certain percentage of identical central patterns between two design patterns to be matched.

6. The method as claimed in claim 3, wherein said multi-stage pattern matching and grouping further includes a step of data filtering and statistical analysis for reducing an amount of data in each of the plurality of wafer inspection data before said first stage processing.

7. The method as claimed in claim 1, wherein said multi-stage pattern matching and grouping includes:
   first stage processing that executes a plurality of instances of first stage pattern matching and grouping, each instance receiving wafer inspection data of one or more wafers and generating a first stage output data;
   at least one stage of intermediate processing that executes a plurality of instances of intermediate stage pattern matching and grouping, each instance receiving one or more output data generated from said first stage processing or a preceding stage of intermediate processing and generating an intermediate stage output data; and
   final stage processing that receives all the intermediate stage output data of a last stage of intermediating processing and executes final stage pattern matching and grouping to identify said highly repeating defects.

8. The method as claimed in claim 7, wherein at least one of said first stage pattern matching and grouping, said intermediate stage pattern matching and grouping and said final stage pattern matching and grouping is identical pattern matching and grouping.

9. The method as claimed in claim 7, wherein at least one of said first stage pattern matching and grouping, said intermediate stage pattern matching and grouping and said final stage pattern matching and grouping is similar pattern matching and grouping, and said similar pattern matching and grouping is accomplished by matching a certain percentage of identical central patterns between two design patterns to be matched.

10. The method as claimed in claim 7, wherein said multi-stage pattern matching and grouping further includes a step of data filtering and statistical analysis for reducing an amount of data in each of the plurality of wafer inspection data before said first stage processing.

11. The method as claimed in claim 1, wherein said lithographic process includes optical proximity correction and said critical hot spots identified by said design signature analytics are used to set up or fine tune an optical proximity correction model and associated recipes of said optical proximity correction model.

12. The method as claimed in claim 1, wherein said design signature analytics comprising the steps of:
   global alignment for compensating coordinate offsets between wafer inspection data and said chip design data;
   full chip pattern correlation for identifying highly repeating defects from the plurality of wafer inspection data, said full chip correlation being accomplished by said multi-stage pattern matching and grouping;
   pattern characterization for extracting design signatures for said highly repeating defects based on design patterns of said highly repeating defects in said chip design data; and
   design signature inference for determining criticality of said design signatures, identifying critical design signatures and ranking criticality of said critical design signatures.

13. The method as claimed in claim 12, wherein said critical design signatures are stored and updated in a critical design signature library.

14. The method as claimed in claim 12, wherein said critical design signatures are used to search through said chip design data for areas whose circuit pattern having said critical design signatures and define said areas as micro care areas for inspecting later manufactured wafers.

* * * * *